(12) United States Patent
Tan et al.

(10) Patent No.: US 8,121,224 B2
(45) Date of Patent: *Feb. 21, 2012

(54) SYSTEMS AND METHODS FOR FILTER BASED MEDIA DEFECT DETECTION

(75) Inventors: Weijun Tan, Longmont, CO (US);
Shaohua Yang, Santa Clara, CA (US);
George Mathew, San Jose, CA (US);
Du Li, Broomfield, CO (US)

(73) Assignee: Agere Systems Inc., Allentown, PA (US)

( * ) Notice: Subject to any disclaimer, the term of this patent is extended or adjusted under 35 U.S.C. 154(b) by 927 days.

This patent is subject to a terminal disclaimer.

(21) Appl. No.: 12/111,268

(22) Filed: Apr. 29, 2008

(65) Prior Publication Data

US 2009/0268848 A1    Oct. 29, 2009

(51) Int. Cl.
*H04L 27/06* (2006.01)
(52) U.S. Cl. ........ 375/341; 375/262; 714/786; 714/794; 714/795
(58) Field of Classification Search .................. 375/341, 375/262; 714/786, 794, 795
See application file for complete search history.

(56) References Cited

U.S. PATENT DOCUMENTS

| | | | | |
|---|---|---|---|---|
| 5,563,746 | A * | 10/1996 | Bliss | ................................ 360/53 |
| 5,680,383 | A * | 10/1997 | Clark et al. | ................. 369/47.17 |
| 5,892,745 | A * | 4/1999 | Belser | ......................... 369/53.33 |
| 6,065,149 | A | 5/2000 | Yamanaka | |
| 6,175,459 | B1 * | 1/2001 | Tomita | .............................. 360/53 |
| 6,691,263 | B2 | 2/2004 | Vasic et al. | |
| 6,738,948 | B2 | 5/2004 | Buckley et al. | |
| 6,882,611 | B2 * | 4/2005 | Chen | ........................... 369/53.15 |
| 6,980,382 | B2 | 12/2005 | Hirano et al. | |
| 7,154,936 | B2 | 12/2006 | Bjerke et al. | |
| 7,168,030 | B2 | 1/2007 | Ariyoshi | |
| 7,203,015 | B2 | 4/2007 | Sakai et al. | |
| 7,237,173 | B2 | 6/2007 | Morita et al. | |
| 7,254,192 | B2 | 8/2007 | Onggosanusi | |
| 7,257,172 | B2 | 8/2007 | Okamoto et al. | |
| 7,359,313 | B2 | 4/2008 | Chan et al. | |
| 7,441,174 | B2 | 10/2008 | Li et al. | |
| 7,688,915 | B2 | 3/2010 | Tanrikulu et al. | |
| 2003/0063405 | A1 | 4/2003 | Jin et al. | |
| 2003/0066020 | A1 * | 4/2003 | Morita et al. | .................. 714/794 |
| 2007/0061687 | A1 | 3/2007 | Hwang | |

(Continued)

OTHER PUBLICATIONS

Kavcic et al., "A Signal-Dependent Autoregressive Channel Model", IEEE Transactions on Magnetics, vol. 35, No. 5, Sep. 1999 pp. 2316-2318.

*Primary Examiner* — Juan A Torres
(74) *Attorney, Agent, or Firm* — Hamilton DeSanctis & Cha (57) ABSTRACT

Various embodiments of the present invention provide systems and methods for media defect detection. For example, a data receiving system is disclosed that includes a data signal provided from a medium that may include a defective portion. An absolute value circuit receives the data signal and provides an output corresponding to an absolute value of the data signal. The output corresponding to the absolute value of the data signal is input to a filter that filters it and provides a filtered output. In some cases, the filter is a digital filter operable to integrate the absolute value of the data signal. A comparator receives the output from the filter and compares it with a threshold value. The result of the comparison indicates a defect status of the medium.

23 Claims, 8 Drawing Sheets

U.S. PATENT DOCUMENTS

| | | |
|---|---|---|
| 2009/0235116 A1 | 9/2009 | Tan et al. |
| 2009/0235146 A1 | 9/2009 | Tan et al. |
| 2009/0268575 A1 | 10/2009 | Tan et al. |
| 2009/0268848 A1 | 10/2009 | Tan et al. |
| 2009/0271670 A1 | 10/2009 | Tan et al. |
| 2010/0042877 A1 | 2/2010 | Tan |

* cited by examiner

SYSTEMS AND METHODS FOR FILTER BASED MEDIA DEFECT DETECTION

BACKGROUND OF THE INVENTION

The present inventions are related to systems and methods for transferring information, and more particularly to systems and methods for determining problems related to a medium associated with a data transfer.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any defects associated with the transfer medium. In some cases, data loss caused by defects in the transfer medium can make recovery of data from the transfer medium difficult even for data received from non-defective areas or times.

Various approaches have been developed for identifying defects in the transfer medium. Such approaches provide a general ability to identify defects, but in many cases are inaccurate. In the best case, this inaccuracy limits the effectiveness of any defect identification. In the worst case, inaccurate defect detection may actually hamper the data recovery process.

Hence, for at least the aforementioned reasons, there exists a need in the art for advanced systems and methods for defect detection.

BRIEF SUMMARY OF THE INVENTION

The present inventions are related to systems and methods for transferring information, and more particularly to systems and methods for determining problems related to a medium associated with a data transfer.

Various embodiments of the present invention provide data receiving systems. Such data receiving systems include a data signal provided from a medium that may include a defective portion. The medium may be, but is not limited to, a magnetic storage medium or a wireless transfer or communication medium. An absolute value circuit receives the data signal and provides an output corresponding to an absolute value of the data signal. The output corresponding to the absolute value of the data signal is input to a filter that filters it and provides a filtered output. In some cases, the filter is a digital filter operable to integrate the absolute value of the data signal. A comparator receives the output from the filter and compares it with a threshold value. The result of the comparison indicates a defect status of the medium.

In some instances of the aforementioned embodiments, the receiving systems include a run length monitor that only allows the indication of a media defect after some number of potentially defective data points are received. In some cases, this run length monitor may be implemented as a counter and a comparator comparing the output of the counter with a programmable threshold. In various cases, an edge extender circuit may also be included that causes the assertion time of a defect signal to be extended to a point preceding the detected error and/or after a detected error to assure that the error is fully captured.

In one or more instances of the aforementioned embodiments, the receiving system further include a detector and a gating circuit. The detector may be, but is not limited to, a soft output Viterbi algorithm detector, or a maximum a posteriori detector. The detector receives the data signal and provides a first soft output indicating a likelihood that the data signal was correctly detected. The gating circuit receives the first soft output, and provides a second soft output. The second soft output corresponds to the first soft output except that the second soft output is reduced during periods corresponding to assertion of the defect detect. In some cases, the receiving systems further include a decoder that receives the second soft output and provides a decoded output. The decoder may be, but is not limited to, low density parity check decoder.

Other embodiments of the present invention provide methods for processing a data stream received from a medium with potentially defective portions. Such methods include sampling an analog data signal to create a digital data signal. The digital data signal is filtered. In some cases, this may be a low pass filter or a band pass filter. It is then determined whether the filtered digital data signal exceeds a first programmable threshold. Where the first programmable threshold is exceeded, a count value is incremented, and a media defect signal is asserted where the count value exceeds a second programmable threshold. In some instances of the aforementioned embodiments, the methods further include obtaining an absolute value of the digital data signal. In such cases, low pass filtering the digital data signal operates on the absolute value of the digital data signal.

In some instances of the aforementioned embodiments, the methods further include resetting the count value where the filtered data signal exceeds the first programmable threshold. In some cases, where the count value is reset, the media defect signal is de-asserted. In other cases, the media defect signal is only de-asserted a predetermined plurality of clock cycles after the count value is reset.

In yet other embodiments of the present invention, data processing systems are provided. Such data processing systems include a data signal that is provided to a media defect detector and a data detector. The media defect detector includes an absolute value circuit that receives the data signal and provides an output corresponding to an absolute value of the data signal, a digital filter that receives the output corresponding to the absolute value of the data signal and provides a low pass filtered output, and a comparator that compares the low pass filtered output with a threshold value. The output of the comparator causes a defect detect output to assert. The data processing systems further include a data detector that receives the data signal and provides a first soft output indicating a likelihood that the data signal was correctly detected, and a gating circuit that receives the first soft output. The gating circuit further provides a second soft output that corresponds to the first soft output except that the second soft output is reduced during periods corresponding to assertion of the defect detect output. In addition, the processing systems include a data decoder that receives the second soft output and provides a decoded output.

In various instances of the aforementioned embodiments, another comparator and a counter are included in the data processing systems. In such cases, the counter is operable to output a count value corresponding to a number of periods that the output of the first comparator is asserted. The other comparator compares the count value with a second threshold value, and asserts the defect detect output whenever the count value exceeds the second threshold.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for determining problems related to a medium associated with a data transfer.

Figure 1:
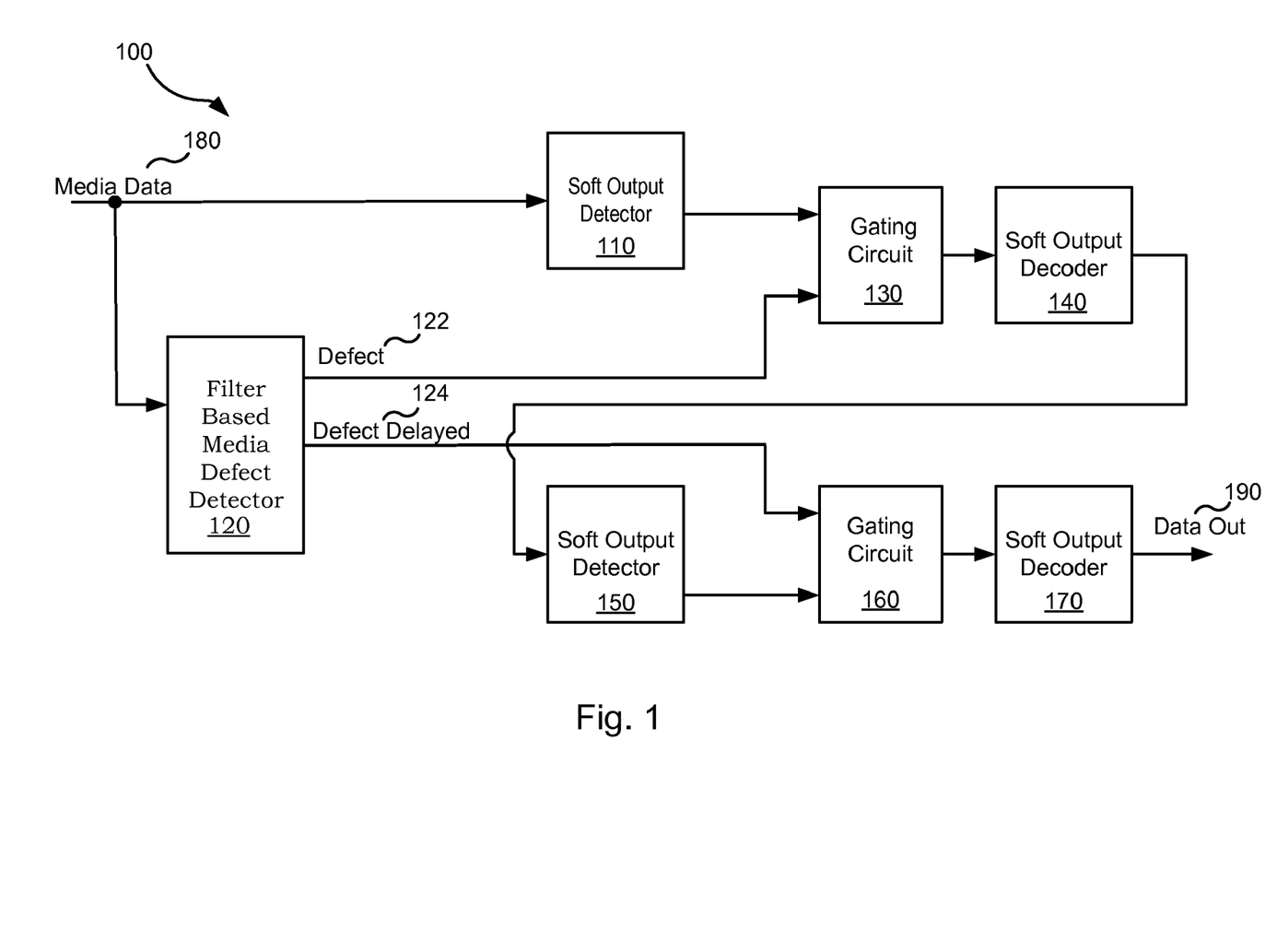
FIG. 1 depicts a defect detection system in accordance with various embodiments of the present invention.

Turning to FIG. 1, a defect detection system 100 in accordance with various embodiments of the present invention is depicted. Defect detection system 100 includes a filter based media defect detector, soft output detectors 110, 150, gating circuits 130, 160, and soft output decoders 140. Soft output detectors 110, 150 may be any detector known in the art that are capable of providing soft output information (i.e., a probability that detected data has been correctly identified). Thus, soft output detectors may be, but are not limited to, soft output Viterbi algorithm detectors (SOVA) or maximum a posteriori probability (MAP) detectors as are known in the art. Based on the disclosure provided herein, one of ordinary skill in the art will recognize a variety of detectors that may be used in relation to different embodiments of the present invention.

Media data 180 is received from some form of media and transferred to defect detection system 100. Thus, for example, where defect detection system 100 is implemented as part of a hard disk drive system, media data 180 may be derived from a magnetic storage medium incorporated in the hard disk drive system. As another example, where defect detection system 100 is implemented as part of a communication system, media data 180 may be derived from a wireless or other transfer medium between a sending and receiving device. Based on the disclosure provided herein, one of ordinary skill in the art will recognize a variety of media from which media data 180 may be derived.

Media data 180 is provided to soft output detector 110 and to filter based media defect detector 120. Soft output detector 110 performs a detection function on media data 180 and provides its results to a gating circuit 130. Filter based media defect detector 120 analyzes media data 180 to determine whether a media defect is indicated. Whenever a defect is identified by filter based media defect detector 120, a defect output 122 and a defect delay output 124 are asserted. Defect output 122 is provided to gating circuit 130 along with the output from soft output detector 110. When defect output 122 is asserted, gating circuit 130 causes the soft output from soft output detector 110 to be asserted such that the indicated probability that media data 180 has been properly detected is zero. This "zero" probability is provided to soft output decoder 140 where it is used to decode media data 180. Soft output decoder 140 may be any data decoder known in the art. By zeroing the soft output information coincident with an identification of a media defect, gating circuit 130 operates to limit the possibility that soft output decoder 140 would improperly identify data from the defective area as correct.

The output from soft output decoder 140 is provided to soft output detector 150 that performs another detection process and provides another soft output indicating the likelihood of correct data. Defect delay output 124 is provided along with the output form soft output detector 150 to gating circuit 160. Defect delay output 124 is a version of defect output 122 delayed sufficiently to match the timing delays incurred by passing media data 180 through gating circuit 130, soft output decoder 140 and soft output detector 150. Similar to gating circuit 130, when defect delay output 124 is asserted, gating circuit 160 causes the soft output from soft output detector 150 to be asserted such that the indicated probability that media data 180 has been properly detected is zero. This "zero" probability is provided to soft output decoder 170 where it is used to decode media data 180. Soft output decoder 170 may be any data decoder known in the art. By zeroing the soft output information coincident with an identification of a media defect, gating circuit 160 operates to limit the possibility that soft output decoder 170 would improperly identify data from the defective area as correct. Soft output decoder 170 provides a data output 190 that may either be used, or may be applied to further detection/decoding stages depending upon the particular design.

Figure 2:
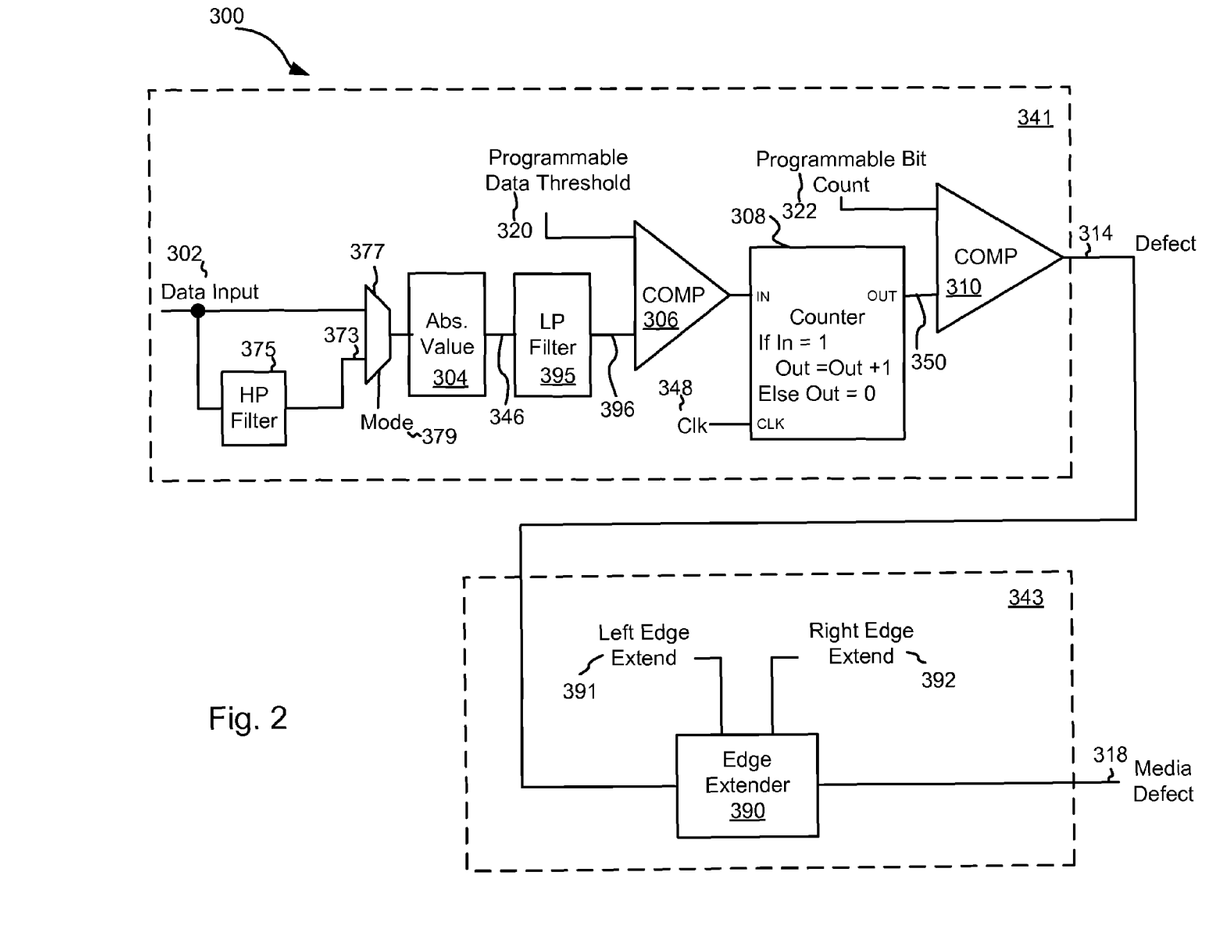
FIG. 2 shows a particular implementation of a defect detection circuit in accordance with some embodiments of the present invention.

Turning to FIG. 2, a filter based media defect detector circuit 300 in accordance with various embodiments of the present invention is shown. Filter based media defect detector circuit 300 includes a data analysis circuit 341 (shown in dashed lines) and detection extender circuitry 343 (shown in dashed lines). Data analysis circuit 341 is designed to identify a potential media defect based on a data input 302 derived from a medium at issue. Detection extender circuitry 343 is designed to extend the detected media defect to render a media defect signal that is asserted for a period corresponding to the duration of the defective media region, or beyond to assure that all potentially defective areas are encompassed.

Data analysis circuit 341 includes a high pass filter 375 and a multiplexer 377 that allows for selection of either a raw data input 302, or a high pass filtered version 373 of data input 302. A mode selector 379 selects the desired data input 302 or filtered version 373. The output of multiplexer 377 is provided to an absolute value circuit 304. Absolute value circuit 304 receives the selected version of data input 302 and performs an offset process to yield the absolute value of the selected version of data input 302. An absolute value 346 of data input 302 is provided to a low pass filter 395, and a filtered output 396 from low pass filter 395 is provided to a comparator 306 that compares the output of low pass filter 395 against a programmable data threshold 320. Where the output of low pass filter 395 exceeds programmable data threshold 320, a counter 308 is cleared. Otherwise, where the output of low pass filter 395 is less than programmable data threshold 320, counter 308 continues to increment synchronous to a clock 348. A counter output 350 is provided to a comparator 310 where it is compared against a programmable bit count 322. Where counter output 350 exceeds programmable bit count 322, a defect indication 314 is asserted based on data input 302.

It should be noted that counter 308, comparator 310 and edge extender 390 may be replaced by other filter/edge extender circuits that may be implemented based on the disclosure provided herein. For example, the output of comparator 306 may be fed to a run length monitor and edge extender as depicted in FIGS. 2a and 4 of U.S. patent application Ser. No. 12/111,255 entitled "Systems and Methods for Media Defect Detection Utilizing Correlated DFIR and LLR Data" and filed on a date even herewith. The entirety of the aforementioned application is incorporated herein by reference for all purposes.

Detection extender circuitry 343 includes circuitry capable of asserting and extending defect output 314. In particular, detection extender circuitry 343 includes an edge extender circuit 390 that receives a left edge extend input 391 and a right edge extend input 392. Edge extender circuit 390 causes the period which defect output 314 is asserted to be extended. This extension allows for a media defect output 318 to be long enough to cover the initial transition from a non-defective region to a detected defect region, through the defective region, and from the defective region transitioning back to the non-defective region. In particular, media defect 318 is defect output 314 extended by an amount consisting of the sum of both the left edge extend input 391 and the right edge extend input 392. In some cases, left edge extend input 391 and right edge extend input 392 are each individually programmable. In some cases, left edge extend input 391 may be increased to provide a left edge extension and to compensate for the delay programmed via programmable bit count 322.

Figure 3:
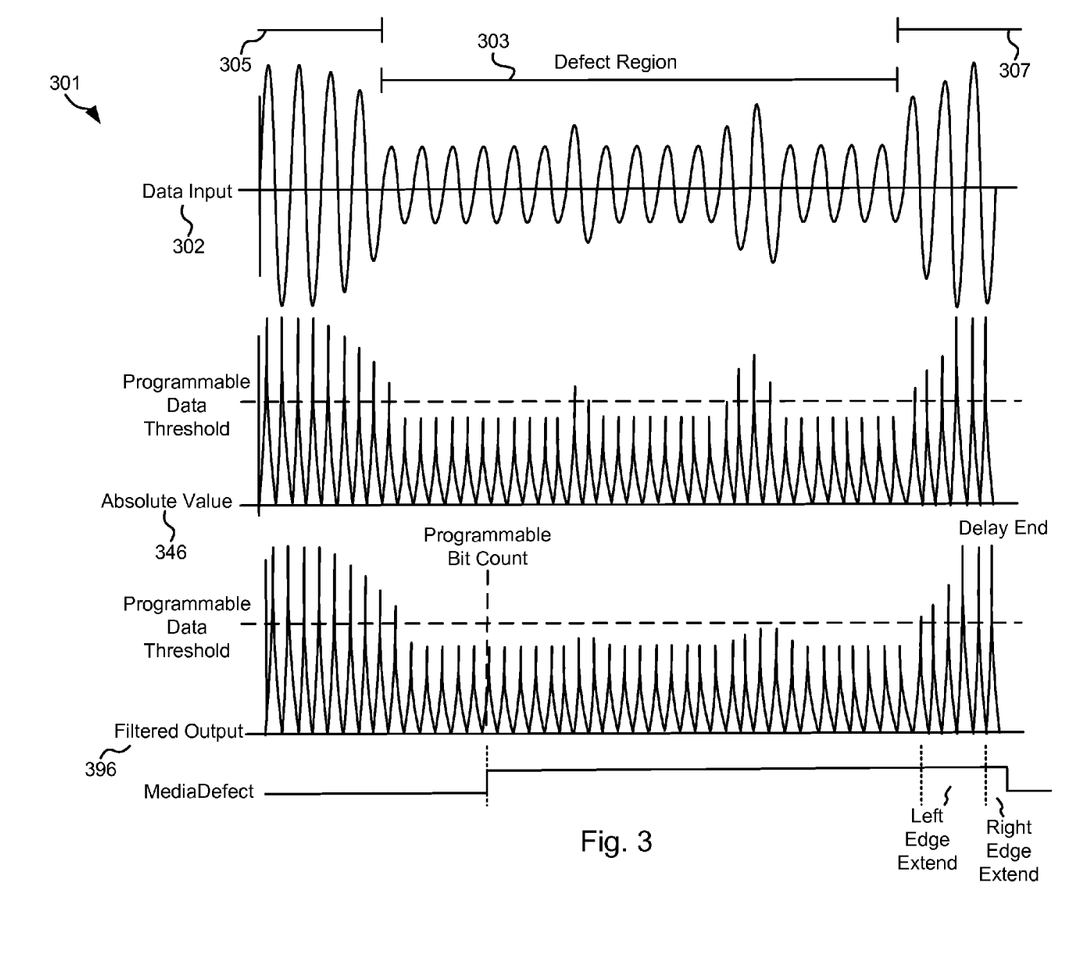
FIG. 3 is a timing diagram of exemplary signals applied to and received from the defect detection circuit of FIG. 2.

Turning to FIG. 3, a timing diagram 301 depicts the operation of filter based media defect detector circuit 300 based on exemplary inputs consistent with those discovered in investigation. In particular, timing diagram 301 shows an exemplary data input 302 including periods where data is received from a non-defective medium 305, 307, and a period 303 where data is received from a defective medium. It should be noted that the various data inputs and outputs are merely exemplary and that circuit operation will vary depending upon the particular data inputs and system implementation. Of note, data from the defective portion includes a DC offset that may be eliminated through use of filter 375 of filter based media defect detector circuit 300. Filter 375 may be designed using any filter techniques known in the art. In one particular embodiment of the present invention, filter 375 is a high pass filter. Such a high pass filter may for example, be simply f=1-ma, where ma is a moving average low pass filter. Where the number of taps is L (which my be programmable), the then the high pass filter is described by the following equation: f=1-[11 . . . ]/L. Further, data from the non-defective medium (portions 305, 307) exhibits a relatively high amplitude when compared with that from the defective medium (portion 303). Timing diagram 301 also depicts absolute value 346 of data input signal 302. In particular, the absolute value signal 346 corresponds to the absolute value signal where mode select 379 selects filtered version 373 of data input 302. Of note, during defect region 303, some of the absolute value samples exceed programmable data threshold and could potentially reset counter 308. Timing diagram 301 shows filtered output 396. Of note, by filtering, samples in absolute value 346, spurious samples that previously exceeded programmable data threshold 320 are reduced using a low pass filtering process.

Once filtered output 396 fails to exceed programmable data threshold 320 for a number of consecutive clock cycles corresponding to programmable bit count 322, media defect output 318 is asserted high. Media defect output 318 remains asserted high until the end of defect region 303 is detected (i.e., defect output 314 asserts low) plus a period equivalent to the sum of left edge extend input 391 and right edge extend input 392. Again, in some cases, left edge extend input 391 and right edge extend input 392 are each individually programmable. In some cases, left edge extend input 391 may be programmed to be programmable bit count 322 plus a programmable edge extend period. Accordingly, media defect 318 may be asserted for a period approximately equal to the length of defect region 303 plus a programmable left and right edge extension, albeit shifted in time.

Figure 4:
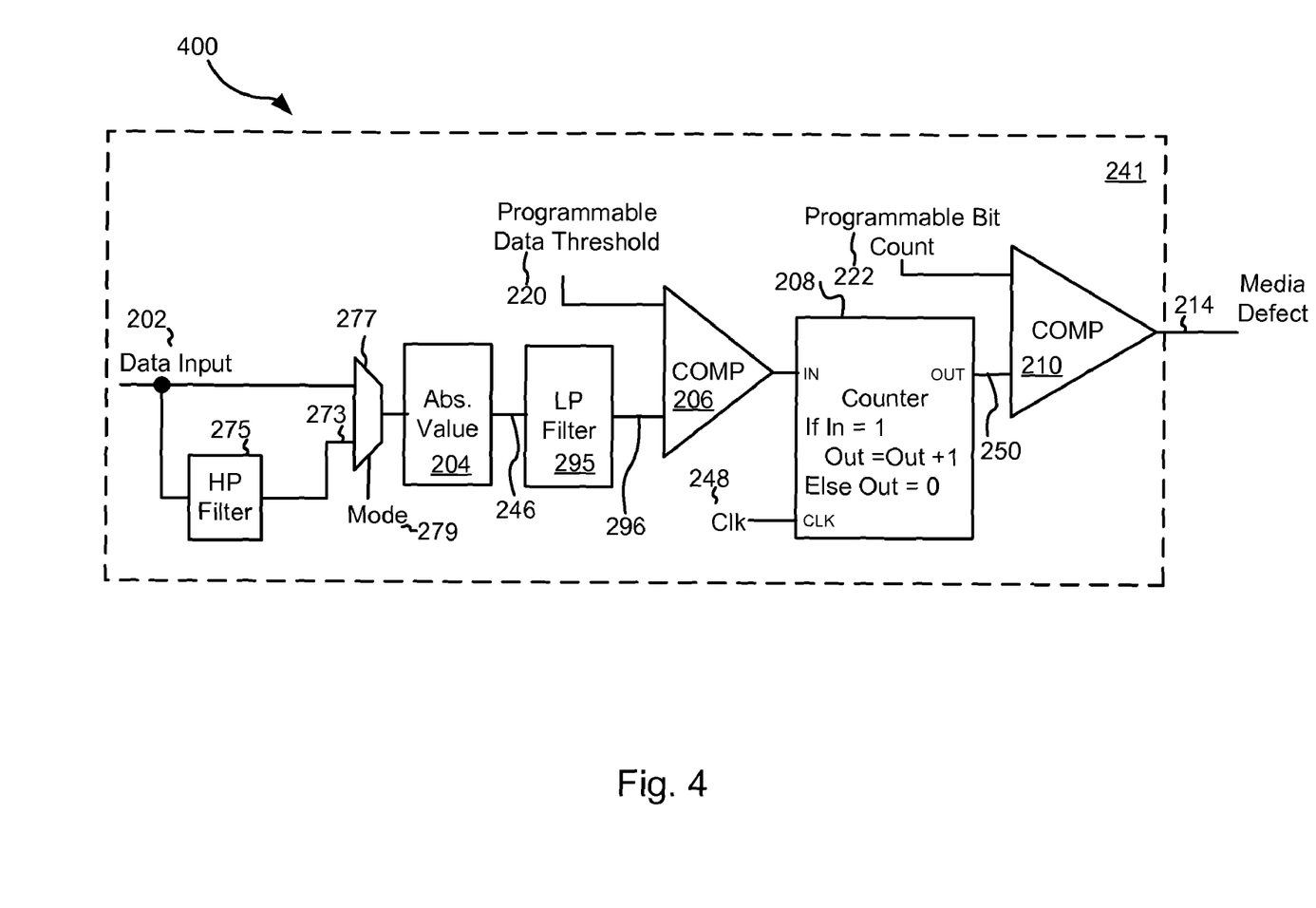
FIG. 4 shows a particular implementation of a defect detection circuit in accordance with some embodiments of the present invention.
Figure 5:
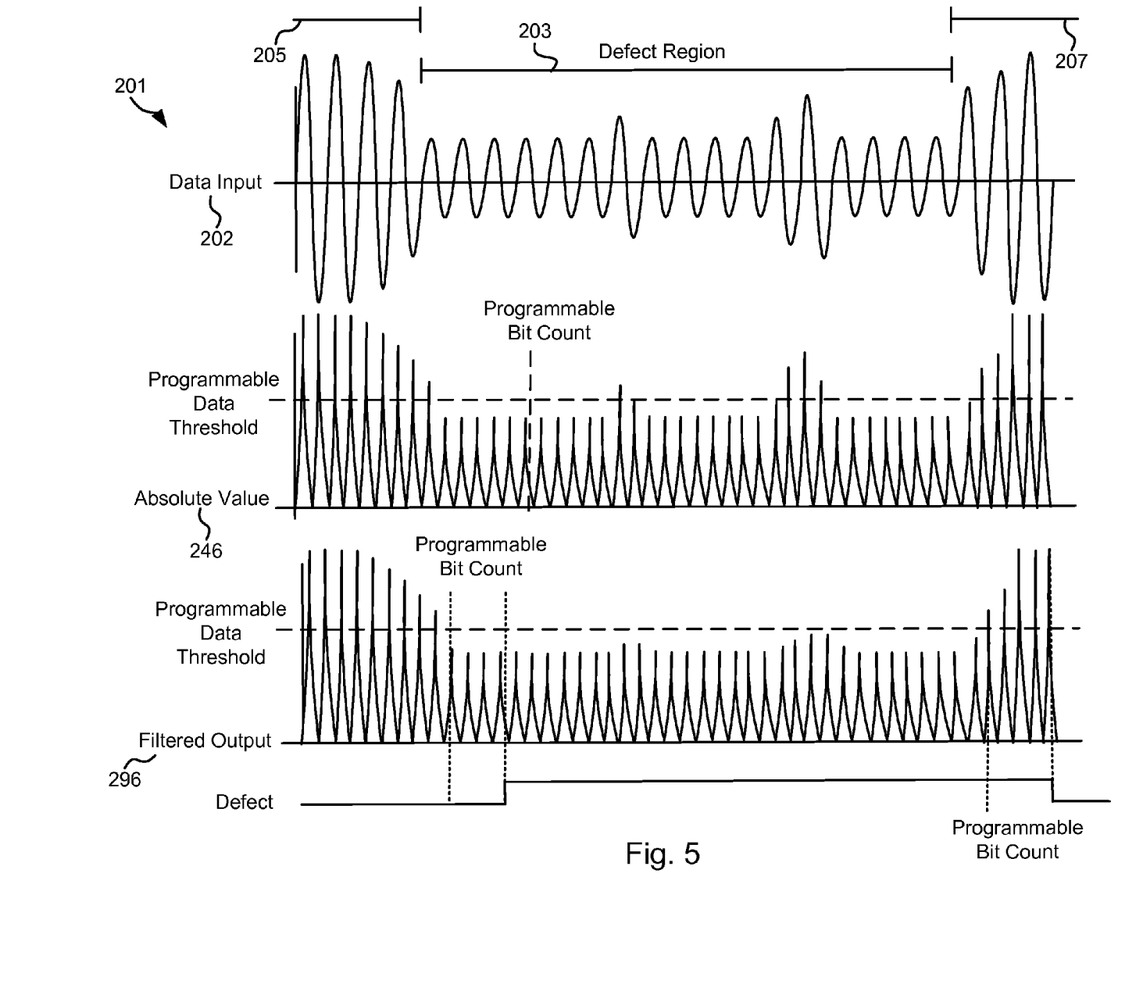
FIG. 5 is a timing diagram of exemplary signals applied to and received from the defect detection circuit of FIG. 2.

Turning to FIG. 4, a filter based media defect detector circuit 400 in accordance with some embodiments of the present invention is shown. Filter based media defect detector circuit 400 includes a data analysis circuit 241 (shown in dashed lines) that is designed to identify a potential media defect based on a data input 202 derived from a medium at issue. Data analysis circuit 241 includes a high pass filter 275 and a multiplexer 277 that allows for selection of either a raw data input 202, or a high pass filtered version 273 of data input 202. A mode selector 279 selects the desired data input 202 or filtered version 273. The output of multiplexer 277 is provided to an absolute value circuit 204. Absolute value circuit 204 receives the selected version of data input 202 and performs an offset process to yield the absolute value of the selected version of data input 202. An absolute value 246 of data input 202 is provided to a low pass filter 295, and a filtered output 296 from low pass filter 295 is provided to a comparator 206 that compares the output of low pass filter 295 against a programmable data threshold 220. Where the output of low pass filter 295 exceeds programmable data threshold 220, a counter 208 is cleared. Otherwise, where the output of low pass filter 295 is less than programmable data threshold 220, counter 208 continues to increment synchronous to a clock 248. A counter output 250 is provided to a comparator 210 where it is compared against a programmable bit count 222. Where counter output 250 exceeds programmable bit count 222, a media defect output 214 is asserted based on data input 202. Thus, media defect output 214 is asserted a programmable bit count after a media defect of substantial length begins. As shown in FIG. 5 below, media defect output 214 remains asserted for the same programmable bit count 222 after the media defect passes.

It should be noted that counter 208 and comparator 210 may be replaced by other filter circuits that may be implemented based on the disclosure provided herein. For example, the output of comparator 206 may be fed to a run length monitor as depicted in FIGS. 2a and 4 of U.S. patent application Ser. No. 12/111,255 entitled "Systems and Methods for Media Defect Detection Utilizing Correlated DFIR and LLR Data" and filed on a date even herewith. The entirety of the aforementioned application is incorporated herein by reference for all purposes.

Turning to FIG. 5, a timing diagram 201 depicts the operation of filter based media defect detector circuit 200 based on exemplary inputs consistent with those discovered in investigation. In particular, timing diagram 201 shows an exemplary data input 202 including periods where data is received from a non-defective medium 205, 207, and a period 203 where data is received from a defective medium. It should be noted that the various data inputs and outputs are merely exemplary and that circuit operation will vary depending upon the particular data inputs and system implementation. Of note, data from the defective portion includes a DC offset that may be eliminated through use of filter 275 of filter based media defect detector circuit 200. Filter 275 may be designed using any filter techniques known in the art. In one particular embodiment of the present invention, filter 275 is a high pass filter. Such a high pass filter may for example, be simply f=1-ma, where ma is a moving average low pass filter. Where the number of taps is L (which my be programmable), the then the high pass filter is described by the following equation: f=1-[11 . . . ]/L. Further, data from the non-defective medium (portions 205, 207) exhibits a relatively high amplitude when compared with that from the defective medium (portion 203). Timing diagram 201 also depicts absolute value 246 of data input signal 202. In particular, the absolute value signal 246 corresponds to the absolute value signal where mode select 279 selects filtered version 273 of data input 202. Of note, during defect region 203, some of the absolute value samples exceed programmable data threshold and could potentially reset counter 208. Timing diagram 201 shows filtered output 296. Of note, by filtering, samples in absolute value 246, spurious samples that previously exceeded programmable data threshold 220 are reduced using a low pass filtering process.

Once filtered output 296 fails to exceed programmable data threshold 220 for a number of consecutive clock cycles corresponding to programmable bit count 222, media defect output 214 is asserted high. Media defect output 214 remains asserted high until a period corresponding to programmable bit count 222 after filtered output 296 exceeds programmable data threshold 220.

Figure 6:
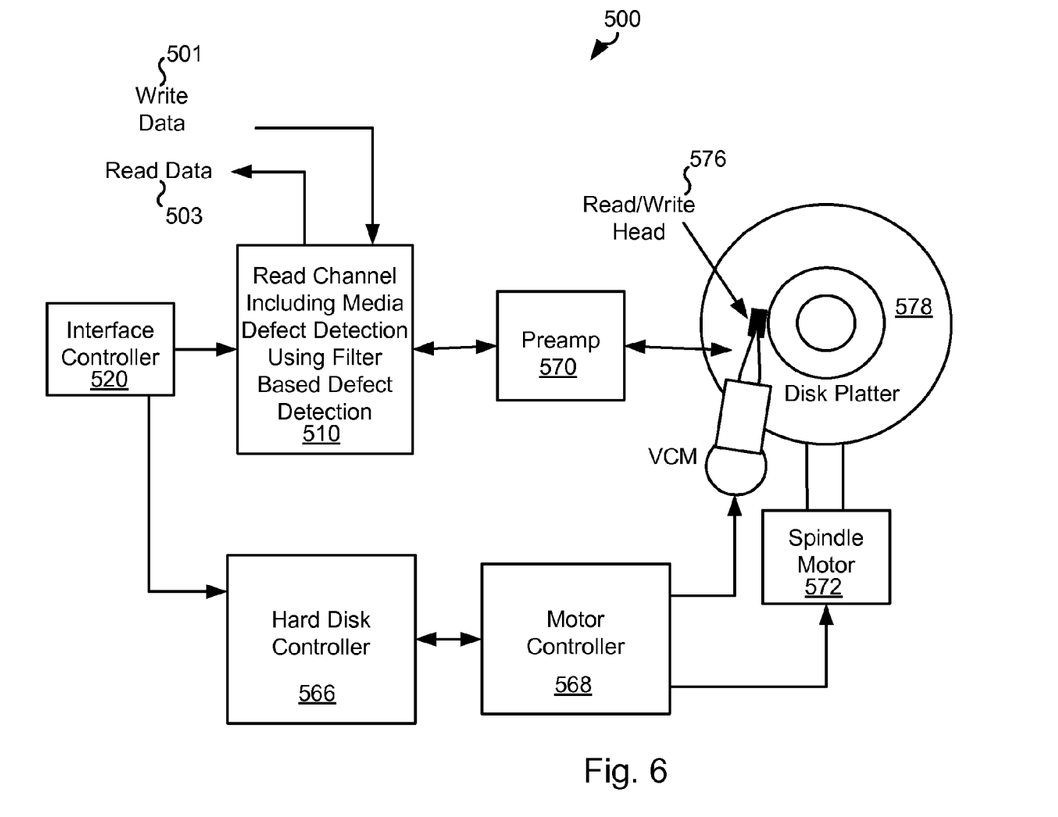
FIG. 6 depicts a storage system including a media defect system in accordance with various embodiments of the present invention.

Turning to FIG. 6, a storage system 500 including a media defect system is shown in accordance with various embodiments of the present invention. Storage system 500 may be, for example, a hard disk drive. Storage system 500 includes a read channel 510 with an incorporated media defect detector. The incorporated media defect detector may be any media defect detector capable of using a filter based approach to form a determination of a media defect. Thus, for example, the incorporated media defect detector may be, but is not limited to, any of soft input defect detection circuits 200, 300. In addition, storage system 500 includes an interface controller 520, a preamp 570, a hard disk controller 566, a motor controller 568, a spindle motor 572, a disk platter 578, and a read/write head 576. Interface controller 520 controls addressing and timing of data to/from disk platter 578. The data on disk platter 578 consists of groups of magnetic signals that may be detected by read/write head assembly 576 when the assembly is properly positioned over disk platter 578. In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 576 at a determined spin rate (RPMs).

Once read/write head assembly 576 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel module 510 via preamp 570. Preamp 570 is operable to amplify the minute analog signals accessed from disk platter 578. In addition, preamp 570 is operable to amplify data from read channel module 510 that is destined to be written to disk platter 578. In turn, read channel module 510 decodes (including media defect detection) and digitizes the received analog signal to recreate the information originally written to disk platter 578. This data is provided as read data 503 to a receiving circuit. A write operation is substantially the opposite of the preceding read operation with write data 501 being provided to read channel module 510. This data is then encoded and written to disk platter 578.

Figure 7:
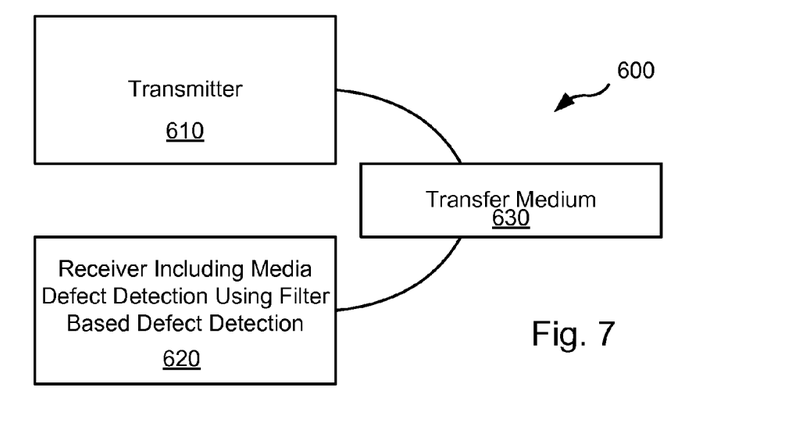
FIG. 7 depicts a communication system including a media defect system in accordance with one or more embodiments of the present invention.

Turning to FIG. 7, a communication system 600 including a receiver 620 with a media defect system in accordance with one or more embodiments of the present invention is shown. Communication system 600 includes a transmitter 610 that is operable to transmit encoded information via a transfer medium 630 as is known in the art. The encoded data is received from transfer medium 630 by receiver 620. Receiver 620 incorporates a media defect detection circuit that is operable to determine whether a "defect" has occurred in transfer medium 630. Thus, for example, where transfer medium 620 is the Internet, it may determine that no signal is being received. Alternatively, where transfer medium 620 is the atmosphere carrying wireless signals, the media defect detection circuit may indicate a very noisy and unreliable transfer environment. Based on the disclosure provided herein, one of ordinary skill in the art will recognize a variety of mediums that may include defects and that may be utilized in relation to different embodiments of the present invention. As an example, the incorporated media defect detector may be, but is not limited to, any of soft input defect detection circuits 200, 300.

Figure 8:
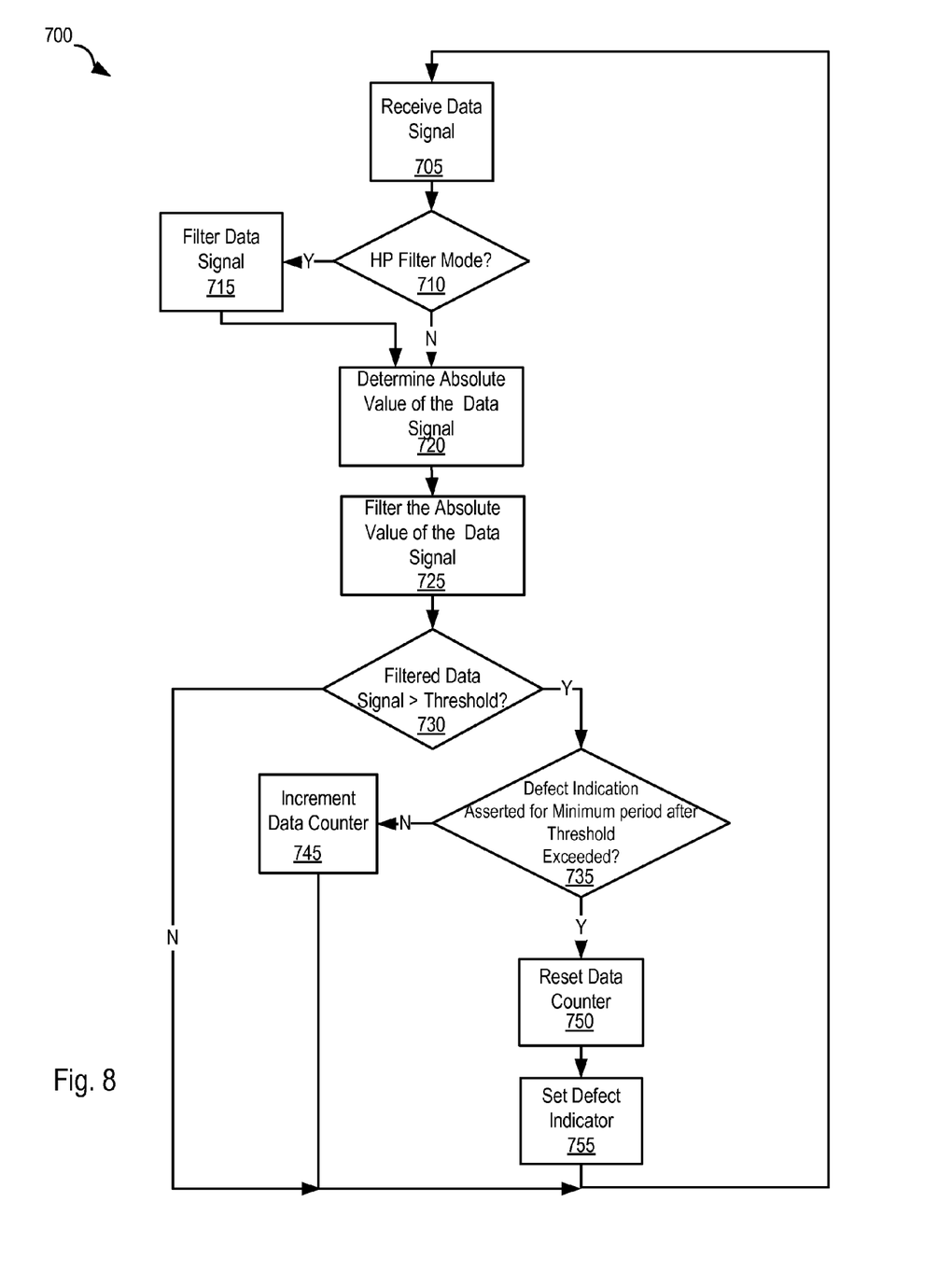
FIG. 8 is a flow diagram depicting a method for media defect detection in accordance with some embodiments of the present invention.

Turning to FIG. 8, a flow diagram 700 depicts a method for media defect detection in accordance with some embodiments of the present invention. Following flow diagram 700, a data signal is received (block 705). This data signal may be, or example, a stream of data received during a read from a hard disk drive or a stream of data received by a communication device. Based on the disclosure provided herein, one of ordinary skill in the art will recognize a variety of data signals and signal sources that may be used in relation to different embodiments of the present invention.

It is determined whether the received data signal is to be filtered (block 710). Where the signal is to be filtered (block 710), the signal is filtered (block 715). This may include, for example, passing the signal through a high pass filter to remove any low frequency offset. In any event, an absolute value of either the filtered signal or the raw signal is determined (block 720). The absolute value of the data signal is then processed using a filter to remove any spurious data points (block 725). This processing operates to remove any single sample or even a small number of grouped samples that exceeds a programmable data threshold and would cause of reset of the counter and would not allow the full extent of a defective media region to be detected. The filtered output is then compared against a data threshold (block 730). The data threshold may be programmable via, for example, a data threshold register. Where the filtered output is less than the data threshold (block 730), the process is returned to receive the next data signal input (block 705). Alternatively, where the filtered output exceeds the data threshold (block 730), it is additionally determined whether the defect indicator was previously asserted and has been asserted for at least a programmable count (block 735).

Where the defect indicator has been asserted for a period corresponding to the programmable count (block 735), the data counter is reset (block 750) and the media defect indicator is asserted (block 755). Once the media defect indicator is asserted (block 755) the process is returned to receive the next data signal (block 705). Alternatively, where the defect indicator was not previously asserted or has not been asserted for at least the minimum programmable count (block 735), the data counter is not reset but is rather incremented. This process of incrementing is continued until sufficient media defect indicating inputs are received. By using a programmed count, a single media defect cannot cause an assertion of a media defect output. This effectively allows for programming a defect sensitivity. Alternatively, where the defect indicator has not been asserted for at least the programmable count value (block 735), the data counter is incremented (block 745) and the process is returned to receive the next data signal (block 705).

Figure 9A:
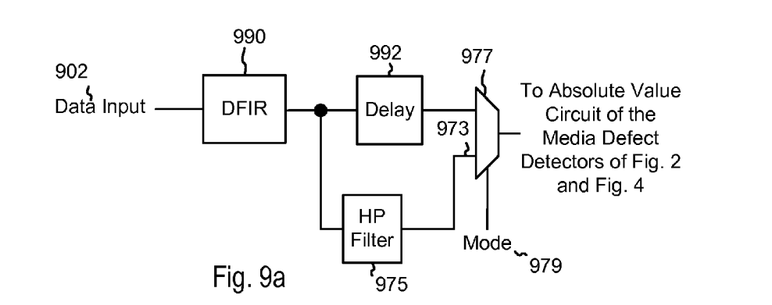
FIGS. 9a-9c depict alternative approaches for driving the input of a media defect detector is depicted in accordance with various embodiments of the present invention.

Turning to FIG. 9a, a digital filter (DFIR) approach for driving the input of a media defect detector is depicted in accordance with various embodiments of the present invention. A data input 902 is provided to a DIFR 990 where it is filtered. DFIR 990 may be any digital FIR filter as are known in the art. The output of DFIR 990 is provided to both a high pass filter 975 and a delay 992. High pass filter 975 corresponds to either filter 275 or filter 375 as described above. Delay 992 is designed to provide similar timing for both a filtered and unfiltered output from a multiplexer 977. A mode selector 979 selects the desired data input (i.e., either filtered or raw). The output of multiplexer 977 is provided to an absolute value circuit as described above in relation to FIG. 2 and FIG. 4. Use of such a DFIR on the data input provides a reduction in the rate of misdetection when compared with a full response equalization scheme, but may incur an increase in false alarm rate due to sensitivity to long runs of Nyquist or DC patterns.

Figure 9B:
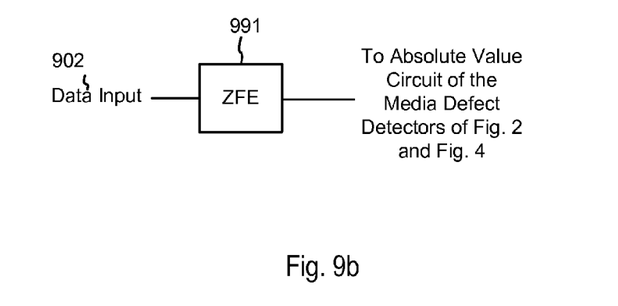

Turning to FIG. 9b, a full response equalizer 991 approach for driving the input of a media defect detector is depicted in accordance with other embodiments of the present invention. In this case, data input 902 is provided to a full response equalizer 991 where it is equalized to, for example, +1 to −1 after normalization. Full response equalizer 991 may be any full response equalizer known in the art. In one particular implementation, full response equalizer 991 is implemented as a zero forcing equalizer (ZFE) as are known in the art. The output of full response equalizer 991 is provided to an absolute value circuit as described above in relation to FIG. 2 and FIG. 4. This results in a decrease in the rate of false alarms due to insensitivity to long runs of Nyquist or DC patterns.

Figure 9C:
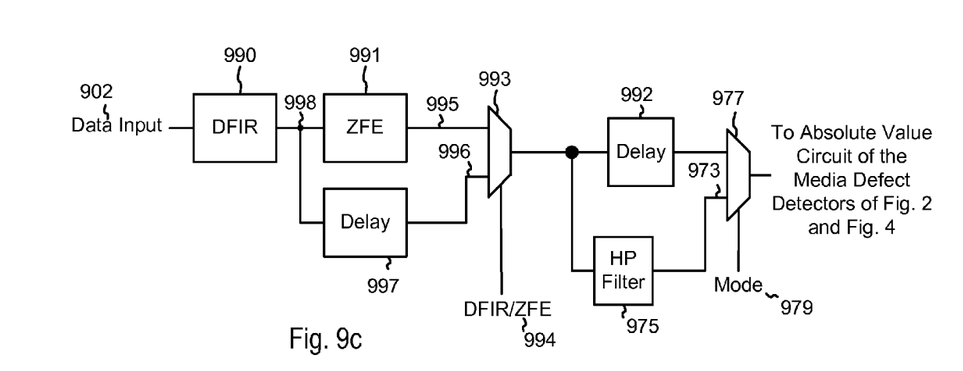

Turning to FIG. 9c, an approach combining DFIR 990 with full response equalizer 991 for driving the input of a media defect detector is depicted in accordance with other embodiments of the present invention. In this approach, a user may select between either a DFIR processed input or a combination of DFIR and full response equalizer processed input depending upon the particular advantage that the user desires to achieve. Data input 902 is provided to DIFR 990 where it is filtered. An output 998 of DFIR 990 is provided to both full response equalizer 991 and a delay 997. Delay 997 is designed to provide similar timing for both an equalized and non-equalized signal output from a multiplexer 993. Delay 997 provides an output 996 and full response equalizer 991 provides an output 995. A DFIR/Full_Response_Equalizer selection input 994 selects the desired data input (i.e., either output 995 or output 996). The output of multiplexer 993 is provided to both high pass filter 975 and delay 992. Mode selector 979 selects the desired data input (i.e., either filtered or raw), and the output of multiplexer 977 is provided to an absolute value circuit as described above in relation to FIG. 2 and FIG. 4.

In conclusion, the invention provides novel systems, devices, methods and arrangements for detecting media defects. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A data receiving system, wherein the receiving system comprises:
   an absolute value circuit operable to receive a data signal derived from a medium and to provide an output corresponding to an absolute value of the data signal;
   a filter operable to receive the output corresponding to the absolute value of the data signal and to provide a filtered output;
   a first comparator, wherein the first comparator is operable to compare the filtered output with a first threshold value, and wherein an output of the first comparator indicates a defect status of the medium;
   a counter operable to output a count value corresponding to a number of periods that the output of the first comparator is asserted; and
   a second comparator operable to compare the count value with a second threshold value, and to assert a defect output whenever the count value exceeds the second threshold.

2. The receiving system of claim 1, wherein the filter is a digital filter operable to integrate the absolute value of the data signal.

3. The receiving system of claim 1, wherein the counter is reset whenever an output of the first comparator exceeds the first threshold value.

4. The receiving system of claim 1, wherein the detector is selected from a group consisting of: a soft output Viterbi algorithm detector, and a maximum a posteriori detector.

5. The receiving system of claim 1, wherein both the first threshold value and the second threshold value are programmable.

6. The receiving system of claim 1, wherein the medium is selected from a group consisting of: a magnetic storage medium, a wireless transfer medium, and a wired transfer medium.

7. The receiving system of claim 1, wherein the data signal is derived from the medium using a circuit including elements selected from a group consisting of: a zero forcing equalizer, a digital finite impulse response circuit, and a combination of a digital finite impulse response circuit driving a full response equalizer.

8. The receiving system of claim 1, wherein the receiving system further comprises:
   an extender circuit operable to provide an extended defect output that remains asserted after the defect output is de-asserted.

9. The receiving system of claim 1, wherein the receiving system further comprises:
- a detector operable to receive the data signal and to provide a first soft output indicating a likelihood that the data signal was correctly detected; and
- a gating circuit operable to receive the first soft output and to provide a second soft output, wherein the second soft output corresponds to the first soft output except that the second soft output is reduced during periods corresponding to assertion of the defect detect.

10. The receiving system of claim 9, wherein the receiving system further comprises:
- a decoder operable to receive the second soft output and to provide a decoded output.

11. The receiving system of claim 10, wherein the decoder is a low density parity check decoder.

12. A method for processing a data stream received from a medium with potentially defective portions, the method comprising:
- sampling an analog data signal to create a digital data signal;
- low pass filtering the digital data signal to create a filtered digital data signal;
- determining whether the filtered digital data signal exceeds a first programmable threshold;
- incrementing a count value where the filtered digital data signal exceeds the programmable threshold; and
- asserting a media defect signal where the count value exceeds a second programmable threshold.

13. The method of claim 12, the method further comprising:
- resetting the count value where the filtered data signal exceeds the first programmable threshold.

14. The method of claim 13, the method further comprising:
- de-asserting a media defect signal upon resetting the count value.

15. The method of claim 13, the method further comprising:
- de-asserting a media defect signal an extended period after resetting the count value.

16. The method of claim 12, wherein the method further comprises:
- obtaining an absolute value of the digital data signal, wherein low pass filtering the digital data signal operates on the absolute value of the digital data signal.

17. A data processing system, wherein the data processing system comprises:
- a media defect detector, wherein the media defect detector includes:
  - an absolute value circuit, wherein the absolute value circuit is operable to receive a data signal and to provide an output corresponding to an absolute value of the data signal;
  - a digital filter, wherein the digital filter is operable to receive the output corresponding to the absolute value of the data signal and to provide a low pass filtered output; and
  - a comparator, wherein the comparator compares the low pass filtered output with a threshold value, and wherein an output of the comparator causes a defect detect output to assert;
- a data detector, wherein the data detector is operable to receive the data signal and to provide a first soft output indicating a likelihood that the data signal was correctly detected;
- a gating circuit, wherein the gating circuit is operable to receive the first soft output, wherein the gating circuit is operable to provide a second soft output, and wherein the second soft output corresponds to the first soft output except that the second soft output is reduced during periods corresponding to assertion of the defect detect output; and
- a data decoder, wherein the data decoder is operable to receive the second soft output and provides a decoded output.

18. The data processing system of claim 17, wherein the comparator is a first comparator, wherein the threshold value is a first threshold value, and wherein the media defect detector further includes:
- a counter, wherein the counter is operable to output a count value corresponding to a number of periods that the output of the first comparator is asserted; and
- a second comparator, wherein the second comparator is operable to compare the count value with a second threshold value, and wherein the second comparator is operable to assert the defect detect output whenever the count value exceeds the second threshold.

19. The data processing system of claim 17, wherein the digital filter is operable to integrate the absolute value of the data signal.

20. The data processing system of claim 18, wherein the data processing system further comprises:
- an extender circuit operable to provide an extended defect output that remains asserted after the defect output is de-asserted.

21. The data processing system of claim 18, wherein the counter is reset whenever an output of the first comparator exceeds the first threshold value.

22. The data processing system of claim 18, wherein both the first threshold value and the second threshold value are programmable.

23. The data processing system of claim 17, wherein the data signal is derived from the medium using a circuit including elements selected from a group consisting of: a zero forcing equalizer, a digital finite impulse response circuit, and a combination of a digital finite impulse response circuit driving a full response equalizer.

* * * * *